United States Patent
Kim

(10) Patent No.: US 8,760,871 B2
(45) Date of Patent: Jun. 24, 2014

(54) DISPLAY DEVICE INCLUDING A THERMAL CONDUCTIVE SHEET

(75) Inventor: Min-Cheol Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 459 days.

(21) Appl. No.: 13/108,360

(22) Filed: May 16, 2011

(65) Prior Publication Data
US 2011/0279982 A1 Nov. 17, 2011

(30) Foreign Application Priority Data
May 17, 2010 (KR) .................. 10-2010-0046010

(51) Int. Cl.
- H05K 7/20 (2006.01)
- H01J 7/24 (2006.01)
- F21V 29/00 (2006.01)
- H05K 1/00 (2006.01)

(52) U.S. Cl.
USPC ........... 361/712; 361/722; 361/749; 361/720; 313/46; 362/373; 174/252; 174/254

(58) Field of Classification Search
USPC .................... 361/704–723, 749–751; 313/46; 362/373; 174/252, 254
See application file for complete search history.

(56) References Cited

U.S. PATENT DOCUMENTS

| | | | | |
|---|---|---|---|---|
| 3,885,195 A * | 5/1975 | Amano | ...................... | 315/169.4 |
| 5,432,626 A | 7/1995 | Sasuga et al. | | |
| 6,534,722 B2 * | 3/2003 | Takaoka | ...................... | 174/254 |
| 7,649,737 B2 * | 1/2010 | Matsuzawa et al. | ..... | 361/679.54 |
| 8,319,419 B2 * | 11/2012 | Kodama et al. | ............... | 313/503 |
| 2005/0231124 A1 | 10/2005 | Choi et al. | | |
| 2006/0202924 A1 * | 9/2006 | Koyama | .......................... | 345/76 |
| 2008/0030989 A1 | 2/2008 | Yang et al. | | |
| 2009/0256471 A1 * | 10/2009 | Kim et al. | ..................... | 313/504 |
| 2010/0014256 A1 * | 1/2010 | Lee | ................ | 361/721 |
| 2013/0229593 A1 * | 9/2013 | Shimojoh | ....................... | 349/58 |

FOREIGN PATENT DOCUMENTS

| | | |
|---|---|---|
| JP | 2001-244070 A | 9/2001 |
| JP | 2005-258395 A | 9/2005 |
| KR | 2001-0061268 A | 7/2001 |
| KR | 10-0696832 B1 | 3/2007 |
| KR | 10-2009-0060042 | 6/2009 |
| KR | 10-0929206 | 11/2009 |

OTHER PUBLICATIONS

Korean Decision to Grant Patent issued by KIPO on Jul. 20, 2011 in Applicant's corresponding Korean Patent Application No. 10-2010-0046010 with English translation.

* cited by examiner

*Primary Examiner* — Zachary M Pape
(74) *Attorney, Agent, or Firm* — Robert E. Bushnell, Esq.

(57) ABSTRACT

A display device having a thinner shape and a uniform luminance includes a display panel that displays images. The display device has upper and lower peripheral regions. A printed circuit board (PCB) is positioned at the back of the display panel to control and drive the display panel and to provide power to the display panel. A thermal conductive sheet is attached to the back of the display panel. In the display device, the thermal conductive sheet includes a base film that is attached to the back of the display panel and is formed of an electrical insulating material. A power supply pattern is formed on the base film to provide power to the display panel. A ground pattern is formed to be spaced apart and electrically insulated from the power supply pattern.

20 Claims, 2 Drawing Sheets

DISPLAY DEVICE INCLUDING A THERMAL CONDUCTIVE SHEET

CLAIM OF PRIORITY

This application makes reference to, incorporates the same herein, and claims all benefits accruing under 35 U.S.C. §119 from an application earlier filed in the Korean Intellectual Property Office on 17 May 2010 and there duly assigned Serial No. 10-2010-0046010.

BACKGROUND OF THE INVENTION

1. Field of the Invention

An aspect of the present invention relates to a display device, and more particularly, to a display device having a thinner shape and a more uniform luminance.

2. Description of the Related Art

Since demands on various types of display devices have recently been significantly increased because of fast development of information society, studies on display devices such as a liquid crystal display device (LCD), a plasma display panel (PDP), a field emission display device (FED), an electrophoretic display device (EPD) and an organic light emitting display device (OLED) have been actively conducted.

SUMMARY OF THE INVENTION

Embodiments of the present invention provide a display device having a thinner shape and a uniform luminance.

In accordance with an aspect of the present invention, there is provided a display device including a display panel for displaying images, the display panel having upper and lower peripheral regions; a printed circuit board (PCB) positioned at the back of the display panel to drive the display panel and to provide power for the display panel; and thermal conductive sheets attached to the back of the display panel. Each thermal conductive sheet includes a base film that is attached to the back of the display panel and is formed of an electrical insulating material; a power supply pattern formed on the base film to apply power to the display panel; and a ground pattern formed to be spaced apart from the power supply pattern.

The power supply pattern may be electrically connected to the PCB through a first connection pad formed at a shorter side of the power supply pattern of the lower peripheral region, and may be electrically connected to the display panel through a second connection pad formed at another shorter side of the power supply pattern of the upper peripheral region.

The power supply pattern may supply power to the display panel through the upper peripheral region of the display panel.

The ground pattern may be electrically connected to the PCB through a third connection pad.

The third connection pad may be formed in the ground pattern on the lower peripheral region, and may be formed in parallel with the first connection pad in the same layer as the first connection pad.

The third connection pad may be formed in the same layer as the ground pattern.

The first and second connection pads may be formed in the same layer as the power supply pattern.

The base film may be formed of a flexible electrical insulating material.

A plurality of power supply patterns may be formed in parallel with each other while being spaced apart from each other on the base film.

The ground pattern may be formed between adjacent power supply patterns.

An opening having the base film exposed therethrough may be formed between the power supply pattern and the ground pattern.

The opening may be formed in a trench shape.

The width of the opening may be narrower than that of the power supply pattern.

The power supply pattern and the ground pattern may be formed to be spaced apart from each other in the same layer on the base film.

The power supply pattern may be formed of an electrical conductive material with low electrical resistance.

The ground pattern may be formed of an electrical conductive material with electrical resistance higher than or identical to that of the power supply pattern.

The power supply pattern may be extended from the lower peripheral region of the back of the display panel up to the upper peripheral region of the display panel, and a plurality of power supply patterns may be formed in parallel with each other while being spaced apart from each other.

The ground pattern may be integrally and formed as one continuous body at the lower peripheral region of the back of the display panel, and may be formed in parallel with each other while being spaced apart from each other at the upper peripheral region of the back of the display panel.

The power supply pattern may be formed from the back of the display panel up to the upper peripheral region of the front of the display panel.

In a display device constructed as an embodiment of the present invention, power supply lines are secured by using thermal conductive sheets attached to the back of the display panel, so that it is unnecessary to add a separate FPCB for power supply and a separate connector to the display device. Accordingly, manufacturing cost may be saved, and the number of processes may be decreased.

Also, a power supply pattern is directly formed on the thermal conductive sheet attached to the back of the display panel, so that the display device may have a thinner shape.

Also, power supply patterns made of an electrical conductive material with low electrical resistance are formed on the back of the display panel, so that a voltage drop may be prevented, thereby equalizing luminance.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
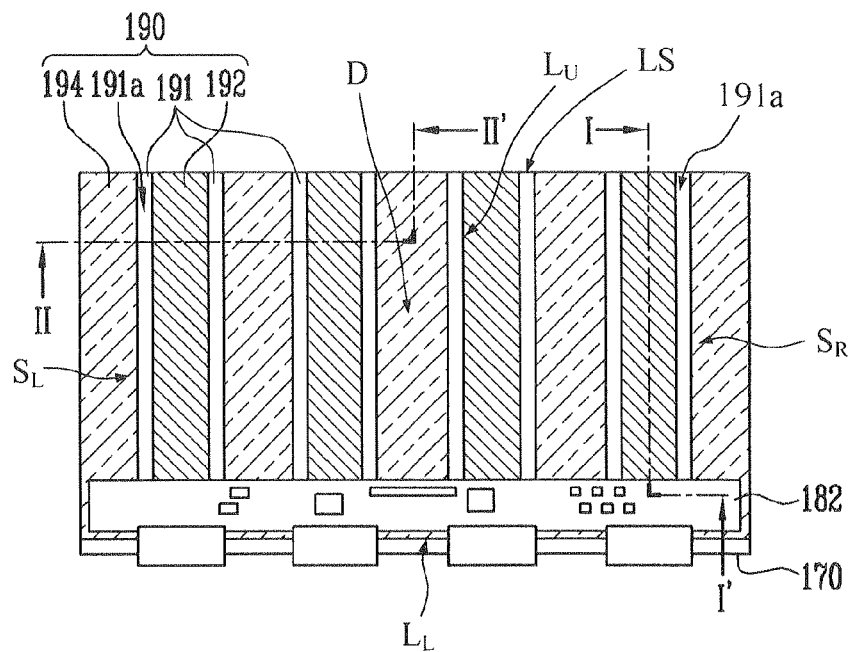
FIG. 1 is a plan view showing the back of a display panel in a display device constructed as an embodiment of the present invention.

The display devices may be classified into a passive matrix type and an active matrix type. In active matrix type display devices, sub-pixels are arranged in a matrix form. The active matrix type display devices are frequently used because they have superior resolution and moving-picture realizing ability compared to passive matrix type display devices.

A display device may include a display unit having a plurality of sub-pixels, a drive unit for supplying a drive signal, and a power supply unit for supplying a pixel power source to the display unit. When a scan signal is supplied, each of the sub-pixels emits light with luminance corresponding to a data signal supplied in synchronization with the scan signal. Accordingly, a display panel displays a desired image.

The pixel power source of the display device determines the luminance of the sub-pixels in addition to the data signal. Therefore, in order to display an image with uniform quality, a pixel power source having the same voltage is necessarily supplied to each of the sub-pixels. The pixel power source is however a direct current (DC) power source having a certain voltage level. While the pixel power source passes through a power line, there occurs a voltage drop (IR drop).

Particularly, since the size of the display panel of the display device is increased and the length of the power line is increased, the luminance variation between pixels may be worsening in dependence upon the distance from a power pad to which a pixel power source is supplied.

Recently, a technique has been proposed for providing a flexible printed circuit board (FPCB) for power supply so as to decrease such luminance variation. Since this technique requires a separate connector connected to the FPCB, the thickness of the display device is increased, and manufacturing cost is also increased.

In the following detailed description, only certain embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Hereinafter, a display device constructed as an embodiment of the present invention will be described in detail with respect to the accompanying drawings.

Shapes, sizes, rates, angles, numbers and the like illustrated in the accompanying drawings are illustrative, and may be modified to some extent. Since the drawings are illustrated at observer's sight, directions or positions in which the drawings are described may be variously modified depending on observer's positions. Like reference numerals may be used to indicate like parts throughout the drawings.

When the terms 'comprise', 'have', 'include' and the like are used, other parts may be added as long as the term 'only' is not used. The singular forms may be interpreted as the plural forms. Even though the terms 'about', 'substantially' and the like are not used, shapes, comparisons between sizes, relations between positions, and the like are interpreted to include an ordinary error range.

Even though the terms 'after', 'before', 'subsequently', 'also', 'here', 'at this time' and the like are used, they are not used to limit temporal positions. The terms 'first', 'second', 'third' and the like are selectively, mutually or repeatedly used for distinguishing between similar elements and not used as confined meanings.

When the position relation between two parts is described using the terms 'on', 'above', 'below', 'next' and the like, one or more parts may be positioned between the two parts as long as the term 'immediately' is not used. When parts are linked by the term 'or', they are interpreted individually or in combination, but when they are linked by the term 'or one of', they are only interpreted individually.

Figure 2A:
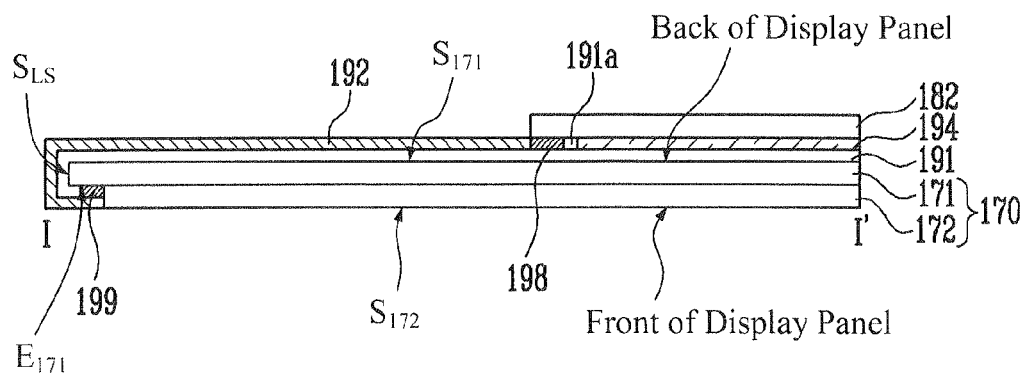
FIG. 2A is a sectional view taken along line I-I' of the display panel shown in FIG. 1.
Figure 2B:
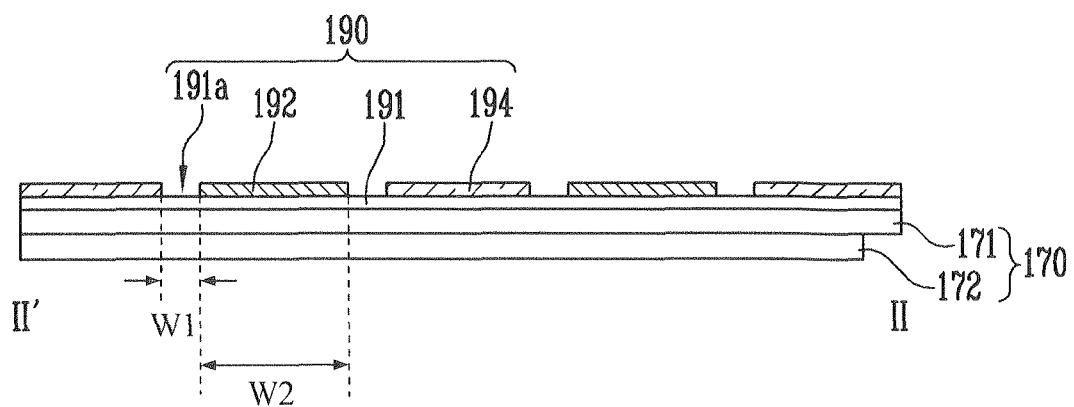
FIG. 2B is a sectional view taken along line II-II' of the display panel shown in FIG. 1.
Figure 3:
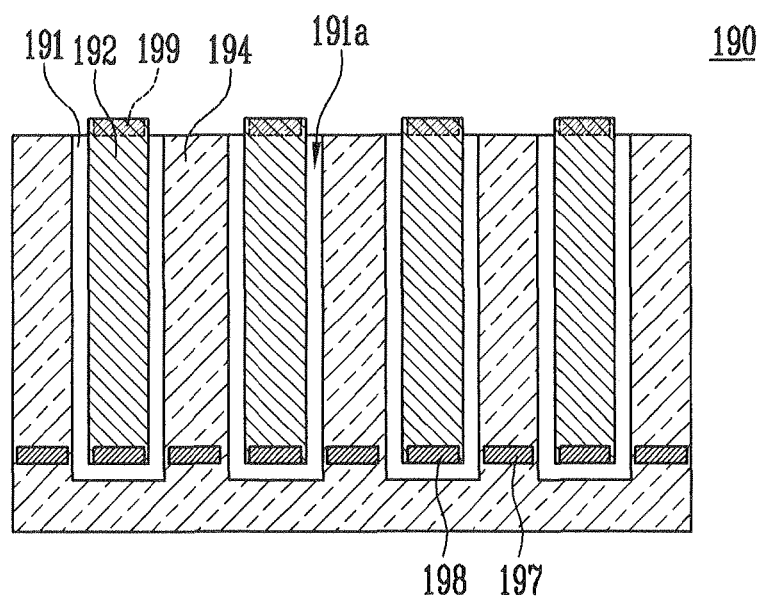
FIG. 3 is an exploded plan view showing a thermal conductive sheet attached to the back of the display device shown in FIG. 1.

FIG. 1 is a plan view showing the back of a display panel in a display device constructed as an embodiment of the present invention. FIG. 2A is a sectional view taken along line I-I' of the display panel shown in FIG. 1. FIG. 2B is a sectional view taken along line II-II' of the display panel shown in FIG. 1. FIG. 3 is an exploded plan view showing a thermal conductive sheet attached to the back of the display device shown in FIG. 1.

Referring to FIGS. 1 through 2B, the display device constructed as the embodiment of the present invention includes a display panel 170 for displaying images, a printed circuit board (PCB) 182 for controlling and driving the display panel 170 and supplying a power source to the display panel 170, and a thermal conductive sheet 190 attached to the back of the display panel 170.

The display panel 170 includes a front substrate 172 and a rear substrate 171, which display images, and a plurality of sub-pixels are formed in the space (not shown) between the front and rear substrates 172 and 171. The front and rear substrates 172 and 171 include long sides opposite to each other and short sides opposite to each other. The front and rear substrates 172 and 171 may be glass substrates having a rectangular plate shape.

The display panel 170 is defined by a display region D and peripheral regions, and the peripheral regions correspond to a frame of the display region. Each of the peripheral regions corresponding to the long sides may be defined by an upper peripheral region $L_U$ and a lower peripheral region $L_L$. Each of the peripheral regions corresponding to the short sides may be defined by a left peripheral region $S_L$ and a right peripheral region $S_R$.

A plurality of sub-pixels may be formed in the display region D of the display panel 170, and a drive signal line (not shown) and a drive element (not shown) may be formed in the peripheral regions.

The PCB 182 is positioned at the back of the display panel 170. The PCB 182 receives a drive power source (Vdd) for driving the display panel 170 and a common power source (Vcom) supplied from the exterior of the display device 170 so as to apply these power sources to the display panel 170. To this end, a system circuit unit may be mounted on the PCB 182.

The system circuit unit may include a power supply for supplying a power source to the display panel 170, include gate and data drivers for respectively supplying gate and data signals, and include a drive controller for controlling the gate and data signals.

The power supply, the gate driver, the data driver and the drive controller may be mounted together on single PCB, or alternatively, may be mounted on separate PCBs, respectively. The PCB 182 may be disposed to correspond to the lower peripheral region of the back of the display panel 170.

Each thermal conductive sheet 190 is attached to the back of the display panel 170 to radiate heat generated from the display panel 170 to the exterior of the display panel 170 or to serve as a sheet for heat radiation and dissipation, the thermal conductive sheet 190 serve to equalize the temperature distribution of the display panel 170. In addition, the thermal conductive sheet 190 constructed as an embodiment of the principles of the present invention serves as a ground path along which a power signal is supplied to the display panel 170. To this end, each of the thermal conductive sheets 190 constructed as the embodiment of the principles of the present invention includes a base film 191, a power supply pattern 192 and a ground pattern 194 formed to be spaced apart from each other on the base film 191, and connection pads 197, 198 and 199. In one embodiment, the ground pattern 194 and the power supply pattern 192 are disposed on the base film 191, and the ground pattern 194 may be spaced apart from the power supply pattern 192 by the trench-shaped opening 191a.

The base film 191 may be directly attached to the back of the display panel 170, and may be positioned on a front of the rear substrate 171 of the display panel 170. In one embodiment, the base film 191 may be attached to the entirety of the back of the display panel 170. In one embodiment, the base film 191 may be directly attached to a surface S171 of the rear substrate 171 with the surface S171 facing towards the exterior of the display panel 170. A surface S172 of the front substrate 172 may face towards the exterior of the display panel 170. The surface S171 of the rear substrate 171 and the surface S172 of the front substrate 172 are opposite to each other.

As shown in FIG. 2A, the base film 191 may be extended from the back of the display panel 170 up to a side $S_{LS}$ of one long side LS of the rear substrate 171 so that the power supply pattern 192 formed on the base film 191 is easily connected to the front of the display panel 170.

In one embodiment, the base film 191 may surround the upper peripheral region of the back of the display panel 170.

In another embodiment, the base film 191 may surround the upper peripheral region of the back of the display panel 170, surround the side $S_{LS}$ of one long side LS of the rear substrate 171, and surround an upper peripheral region $E_{171}$ of the rear substrate 171.

The base film 191 is formed of a flexible electrical insulating material so that the power supply pattern 192 and the ground pattern 194, positioned on the base film 191, may be electrically insulated from each other.

Meanwhile, the base film 191 may include a same electrical conductive material as the ground pattern 194. When the base film 191 includes the same conductive material as the ground pattern 194, a separate electrical insulative material is necessarily formed between the power supply pattern 192 and the ground pattern 194 and between the power supply pattern 192 and the base film 191 so that the power supply pattern 192 and the ground pattern 194 are electrically insulated from each other.

Therefore, when the base film 191 is formed of an electrical insulating material so that the power supply pattern 192 and the ground pattern 194 on the base film 191 are electrically insulated from each other, thus the processes of manufacturing the display device may be simplified.

The power supply pattern 192 is formed on the base film 191 to apply a drive power source (Vdd) to the display panel 170. Here, the drive power source Vdd is a power signal applied through the PCB 182 from the exterior of the display device. A plurality of power supply patterns 192 are formed in parallel with each other on the base film 191 which is attached to the back of the display panel 170. The plurality of power supply patterns 192 are spaced apart from each other.

The power supply pattern 192 may be extended from the back of the lower peripheral region of the rear substrate 171 to surround the upper peripheral region $E_{171}$ of the front of the rear substrate 171. In one embodiment, the power supply pattern 192 may be formed to cover the surface S171 of the rear substrate 171 with the surface S171 facing towards the exterior of the display panel 170. In this case, the power supply pattern 192 may be extended further than the base film 191. The power supply pattern 192 may be disposed directly on the base film 191 and surround the base film 191.

The power supply pattern 192 is electrically connected to the PCB 182 through a first connection pad 198 formed on the lower peripheral region of the display panel 170 so as to receive a power signal supplied from the exterior of the display device. Also, the power supply pattern 192 is electrically connected to the display panel 170 through a second connection pad 199 formed on the upper peripheral region of the display panel 170 so as to supply the power signal to the display panel 170.

The power supply pattern 192 may be formed from the back of the display panel 170 up to the upper peripheral region of the display panel 170, so that the power signal may also be supplied to the upper peripheral region of the display panel 170. In one embodiment, the power supply pattern 192 may be formed from the back of the display panel 170 up to the upper peripheral region of the front of the display panel 170, so that the power signal may also be supplied to the upper peripheral region of the front of the display panel 170. In one embodiment, the power supply pattern 192 may cover the side $S_{LS}$ of one long side LS of the rear substrate 171. Accordingly, a voltage drop may be reduced, thereby equalizing luminance.

Meanwhile, the first connection pad 198 may be formed at a shorter side of the power supply pattern 192 of the lower peripheral region, and the second connection pad 199 may be formed at another shorter side of the power supply pattern 192 of the upper peripheral region. In this case, as shown in FIG. 3, the second connection pad 199 and the first connection pad 198 may be respectively formed at two opposite sides of the power supply pattern 192 in an exploded plan view. In one embodiment, the second connection pad 199 and the first connection pad 198 may be respectively formed at two opposite shorter sides of the power supply pattern 192 in an exploded plan view. As such, the first and second connection pads 198 and 199 constructed as the embodiment of the present invention are formed in the same layer as the power supply pattern 192, so that the display device may have a thinner shape.

The power supply pattern 192 is formed of an electrical conductive material with low electrical resistance, for example, not higher than 10Ω. In this case, the electrical resistance of the material that constitutes the power supply pattern 192 may be lower than or identical to that of the material that constitutes the ground pattern 194. The power supply pattern 192 constructed as the embodiment of the present invention is formed of an electrical conductive material with low electrical resistance, thereby decreasing the voltage drop.

In accordance with the embodiment of the present invention, the power supply pattern 192 may be directly formed on the flexible base film 191, so that it is unnecessary to provide a separate flexible printed circuit board (FPCB) and a connector through which the FPCB is connected to the PCB 182.

In accordance with the embodiment of the present invention, the power supply pattern 192 is directly formed on the base film 191 that constitutes the thermal conductive sheet 190, so that manufacturing cost may be saved and the number of processes may be decreased. Also, the power supply pattern 192 is formed to constitute the thermal conductive sheet 190 attached to the back of the display panel 170, so that the display device may have a thinner shape.

Ground patterns 194 may be formed between adjacent power supply patterns 192.

The ground pattern 194 may be formed on the base film 191 and be electrically insulated from the power supply pattern 192. The ground pattern 194 is formed on the same layer as the base film 191 while being spaced apart from the power supply pattern 192.

The ground and power supply patterns 194 and 192 are electrically insulated from each other by a trench-shaped opening 191a through which the base film 191 is exposed. The width W1 of the opening 191a may be formed narrower than the width W2 of the power supply pattern 192. The opening 191a may be formed from the upper peripheral region of the display panel up to the region at which the PCB 182 is positioned.

The ground patterns 194 are formed in parallel with each other while being spaced apart from each other with the power supply pattern 192 and the opening 191a, interposed therebetween. The ground patterns 194 are integrally and continuously extended at the lower peripheral region of the back of the display panel 170. The ground pattern 194 is formed of an electrical conductive material with electrical resistance higher than or identical to that of the material that constitutes the power supply pattern 192.

Referring to FIG. 3, a third ground pad 197 is formed in each of the ground patterns 194 formed at the lower peripheral region of the back of the display panel 170. The ground pattern 194 and the PCB 182 are electrically connected to each other through the third connection pad 197.

A plurality of third connection pads 197 are formed in parallel with each other, thereby decreasing electrical resistance. In this case, the number of third connection pads 197 is not limited to that shown in FIG. 3. The third connection pads 197 are formed in parallel with each other while being spaced apart from the first connection pads 198. The third connection pad 197 is formed in the same layer as the ground pattern 194 so that the third connection pad 197 is included in the ground pattern 194.

Meanwhile, the first, second and third connection pads 198, 199 and 197 are formed in the same layer as the power supply pattern 192. The first, second and third connection pads 198, 199 and 197 are formed in the same layer as the power supply pattern 192, so that it is possible to prevent the thickness of the display device from being increased.

According to the embodiment of the present invention, the thermal conductive sheet 190 serves not only as a ground but also as a power supply, so that the luminance of the display device may be equalized, and separate components are not required. Accordingly, manufacturing cost can be reduced, and the display device can have a thin shape.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A display device, comprising:
    a display panel displaying variable images, the display panel having a first peripheral region and a second and lower peripheral region;
    a printed circuit board (PCB) positioned at a back of the display panel, and the PCB controlling and driving the display panel and providing electrical power to the display panel; and
    a thermal conductive sheet attached to the back of the display panel, the thermal conductive sheet comprising:
        a base film that is attached to the back of the display panel and is formed of an electrical insulating material;
        a power supply pattern formed on the base film and the power supply pattern providing the electrical power to the display panel; and
        a ground pattern formed on the base film and disposed to be spaced apart from the power supply pattern.

2. The display device according to claim 1, wherein the power supply pattern is electrically connected to the PCB with a first connection pad formed at one shorter side of the power supply pattern of the second peripheral region of the display panel, and is electrically connected to the display panel with a second connection pad formed at another shorter side of the power supply pattern of the first peripheral region.

3. The display device according to claim 1, wherein the power supply pattern supplies the electrical power to the display panel from the first peripheral region of the display panel.

4. The display device according to claim 2, wherein the ground pattern is electrically connected to the PCB with a third connection pad.

5. The display device according to claim 4, wherein the third connection pad is formed in the ground pattern and on the second peripheral region of the back of the display panel, and the third connection pad is formed in parallel with the first connection pad in a same layer as the first connection pad.

6. The display device according to claim 4, wherein the third connection pad is formed in a same layer as the ground pattern.

7. The display device according to claim 4, wherein the first and second connection pads are formed in a same layer as the power supply pattern.

8. The display device according to claim 1, wherein the base film is formed of a flexible electrical insulating material.

9. The display device according to claim 1, wherein a plurality of power supply patterns are formed in parallel with each other on the base film while being spaced apart from each other.

10. The display device according to claim 1, wherein the ground pattern is formed between adjacent power supply patterns.

11. The display device according to claim 1, wherein an opening through which the base film is exposed is formed between the power supply pattern and the ground pattern.

12. The display device according to claim 11, wherein the opening is formed in a trench shape.

13. The display device according to claim 11, wherein the width of the opening is narrower than that of the power supply pattern.

14. The display device according to claim 1, wherein the power supply pattern and the ground pattern are formed to be spaced apart from each other in a same layer on the base film.

15. The display device according to claim 1, wherein the power supply pattern is formed of an electrical conductive material with an electrical resistance higher than zero $\Omega$ and lower than or identical to 10 $\Omega$.

16. The display device according to claim 1, wherein the ground pattern is formed of an electrical conductive material with an electrical resistance higher than or identical to that of the power supply pattern.

17. The display device according to claim 1, wherein the power supply pattern is extended from the second peripheral region of the back of the display panel up to the first peripheral region of the display panel, and a plurality of power supply patterns are formed in parallel with each other while being spaced apart from each other.

18. The display device according to claim 1, wherein the ground patterns are integrally and continuously formed at the second peripheral region of the back of the display panel, and are formed in parallel with each other while being disposed spaced apart from each other at the first peripheral region of the back of the display panel.

19. The display device according to claim 1, wherein the power supply pattern is formed from the back of the display panel up to the first peripheral region of a front of the display panel.

20. The display device according to claim 1, wherein the base film covers an entirety of the back of the display panel.

* * * * *